United States Patent [19]

Watson

[11] Patent Number: 5,736,281
[45] Date of Patent: Apr. 7, 1998

[54] DOSE MODIFICATION PROXIMITY EFFECT COMPENSATION (PEC) TECHNIQUE FOR ELECTRON BEAM LITHOGRAPHY

[75] Inventor: George Patrick Watson, Avon, N.J.

[73] Assignee: Lucent Technologies Inc., Murray Hill, N.J.

[21] Appl. No.: 660,632

[22] Filed: Jun. 7, 1996

[51] Int. Cl.$^6$ ............................................. G03C 5/00
[52] U.S. Cl. .......................... 430/30; 430/296; 430/942
[58] Field of Search ........................... 430/30, 296, 942

[56] References Cited

U.S. PATENT DOCUMENTS

| | | | |
|---|---|---|---|
| 4,988,284 | 1/1991 | Liu et al. | 430/296 |
| 5,278,419 | 1/1994 | Takahashi et al. | 250/492.2 |
| 5,432,714 | 7/1995 | Chung et al. | 364/525 |

OTHER PUBLICATIONS

F. Murai, et al., "fast proximity effect correction method using a pattern area density map" *J. Vac. Sci. Technol.* vol. B 10(6) pp. 3072–3076 (1992).

M. Parikh "Corrections to proximity effects in electron beam lithography" *J. Appl. Phys.* vol. 50(6) (1979).

T.R. Groves "Efficiency of electron-beam proximity effect correction" *J. Vac. Sci Technol.* B 11(6) (1993).

*Primary Examiner*—Christopher G. Young
*Attorney, Agent, or Firm*—Patricia A. Verlangieri

[57] ABSTRACT

A method of compensating for proximity effects in electron beam lithography systems is disclosed. An uncorrected dose profile is obtained for the pattern features to be introduced into a layer of electron beam sensitive material, including a determination of the clearing dose for the electron beam sensitive resist and the dose height for each edge of the pattern feature. Thereafter the incident dose of exposure energy for introducing an image of the pattern into a layer of electron beam sensitive material is adjusted by designating the clearing dose for each edge of the pattern feature as a function of the dose height. The uncorrected dose profile for determining the dose height and the clearing dose is optionally obtained from a calibration step. Each feature is optionally partitioned into a plurality of subshapes and the incident dose of exposure energy is then adjusted for each edge of each subshape by designating the clearing dose for each edge of each subshape as a function of the dose height.

8 Claims, 2 Drawing Sheets

ELECTRON BEAM LITHOGRAPHY SYSTEM  100

ADJUSTED DOSE PROFILE

DOSE MODIFICATION PROXIMITY EFFECT COMPENSATION (PEC) TECHNIQUE FOR ELECTRON BEAM LITHOGRAPHY

FIELD OF THE INVENTION

The present invention relates generally to electron beam lithography systems and, more particularly, to a method of compensating for proximity effects.

DESCRIPTION OF THE RELATED ART

In the technique of electron beam (e-beam) lithography, an electron beam is used to delineate the features of a semiconductor device by selectively irradiating a substrate coated with an electron-beam sensitive material (resist). The electron beam is shaped in a precise manner to define the required features of the semiconductor device in the resist. A pattern representing the features of the semiconductor device is then developed in the resist. Electron beam lithography techniques utilize substrates of a variety of types including semiconductor wafers, and glass or metal plates.

When an electron beam penetrates a material, such as the electron-beam sensitive resist, not all of the electrons in the beg deposit their energy completely in the resist and come to rest in the substrate. Some of the electrons are scattered by collisions with atoms at the surface of the substrate, causing such electrons to be deflected back (backscattered) though the resist and, thereby, exposing a larger region of the resist layer than had originally been intended. The scattering of electrons due to collisions with substrate atoms is termed long range scatter, since the electrons can be backscattered distances on the order of several microns. For example, in an incident electron beam with an exposure energy of 40 keV (kilo electron volts), traveling though a layer of electron beam sensitive resist covering a silicon surface, some of the electrons which impact the silicon surface and are backscattered will have long range scatter distances, back though the resist, approximating 5 μm.

Electrons are also deflected (forward scattered) into the electron beam sensitive resist in regions adjacent to pattern areas, either from collisions between electrons and atoms in the resist material or because the exposure tool could not control the trajectory of all of the electrons in the beam. In particular, problems with the ability of the exposure tool to focus the e-beam as well as electron-electron interactions blurs the electron beam, so that small regions outside of the boundaries of the pattern areas also get exposed. The scattering of electrons due to collisions with resist atoms and/or scattering which results from the exposure tool are combined into one effect termed short range scatter. Short range scatter distances are smaller than long range scatter distances, by several orders of magnitude. For example, in an incident electron beam with an exposure energy of 40 keV (kilo electron volts), traveling through a layer of electron beam sensitive resist covering a silicon substrate, some electrons will have short range scatter distances on the order of 100 nm.

Thus, when the features of a pattern to be exposed in the electron beam sensitive resist are positioned close together, each feature area receives not only a direct dose of electron beam energy, which will hereinafter be referred to as "the incident dose", but also a dose of irradiation due to both long and short range scatter. Consequently, areas of a pattern with closely positioned exposure regions receive larger exposure doses from the same incident dose than do areas of a pattern with isolated exposure regions. This phenomena is referred to as the "proximity effect". In the manufacturing of VLSI (very large scale integrated) circuit masks and/or chips, using e-beam lithography, the proximity effect causes deformations of the developed pattern features and is a major problem, particularly when feature sizes are submicron.

Traditionally, corrections for proximity effects have been divided into two distinct adjustments which are discussed below. A first adjustment is related to the contrast between exposed and unexposed areas of electron beam sensitive resist and reduces proximity effects attributable to long range scatter. The term contrast as used in this disclosure compares the thickness of a layer of electron beam sensitive resist as deposited to the thickness of this same layer after a pattern has been exposed and developed in it. A pattern with an exposed and developed resist thickness that approximates the as deposited resist thickness, possesses high contrast. The second adjustment changes the widths of the features to be exposed in the electron beam sensitive resist, thereby, correcting for proximity effects attributable to short range scatter.

Pattern feature contrast has been improved and the long range scatter of electrons reduced through techniques such as, for example, dose modification methods. The basic idea underlying dose modification proximity effect correction techniques is to reduce the incident dose for features that receive backscatter (long range scatter) exposure so that ideally, all intentionally exposed objects receive the same total exposure dose. Dose modification methods will be further explained with the following illustrative example. With reference to FIG. 1, there is depicted a pattern design 5 containing several features 10, to be exposed in electron beam sensitive resist (not shown) deposited on a substrate (not shown). Each of the rectangular shaped features 10 has a different width as do each of the gaps 15 located between each feature 10. When a pattern such as the one depicted in FIG. 1 is exposed in positive tone resist material, the e-beam only irradiates those regions corresponding to the gaps 15 between each of the features 10. Thereafter, when the resist layer is developed, electron beam sensitive material covers those regions corresponding to the features 10.

An incident dose profile 19 is shown in FIG. 2, illustrating a cross-sectional view of an undeveloped resist layer into which an image of the features 10 pictured in FIG. 1, has been introduced with an incident dose of exposure energy. The incident dose energy for the electron beam is plotted on the vertical axis, while pattern position including feature geometry and gap spacings are depicted along the horizontal axis. Each feature 10 from FIG. 1 corresponds to a trench 30 illustrated in FIG. 2, while the gaps 15 correspond to peaks 25. The solid horizontal line represents the clearing dose 20 for a particular electron beam sensitive resist, for example, positive tone electron beam resist. The clearing dose 20 is the dose of electron beam energy required to completely expose a pattern in a resist layer of a particular thickness. Any area of the pattern that receives an incident dose higher than the clearing dose 20, such as the peaks 25 corresponding to gaps 15, are completely cleared of the resist upon development, while those areas of the pattern that receive an incident dose below the clearing dose 20, such as the trenches 30 corresponding to features 10, will not be cleared of the resist. Thus, with reference to incident dose profile 19 a layer of electron beam sensitive resist into which the pattern of FIG. 1 is exposed and developed (not shown), has raised rectangular features corresponding to the trenches 30 and clear areas corresponding to the peaks 25. The intersection of the clearing dose 20 line across trenches 30 on the dose profile 19, correspond to the edges of each developed resist feature 10. The width of each developed resist feature 10 corresponds to the width of trench 30, where it is bifurcated by the clearing dose line.

In contrast to incident dose profile 19, FIG. 3 illustrates the total dose profile 35 for the features 10 of FIG. 1, showing the actual exposure energy introduced into the undeveloped layer of resist, including proximity effects attributable to long range scatter. The total dose of exposure energy introduced into the layer of resist is plotted on the vertical axis, while the pattern position including feature geometry and gap spacing are again depicted along the horizontal axis. Clearing dose 20 is identical to the clearing dose of FIG. 2. The trenches 43 and 44 of the total dose profile 35 correspond to the features 10 of FIG. 1, while the peaks 45 correspond to the gaps 15. Long range scatter creates a large background dose level 37 in high pattern density regions, such as high pattern density region 38. High pattern density regions are pattern regions where the areas that are exposed to the electron beam energy are located on both sides of a much smaller pattern area that is not exposed (e.g., feature 10 located between two gaps 15). Thus, for high pattern density regions, such as high pattern density region 38, pattern feature contrast is reduced, since such areas receive an additional dose of radiation due to the scattering of electrons. Such reduced pattern feature contrast, is depicted for an undeveloped layer of electron beam sensitive material, by difference 39 shown on FIG. 3. Difference 39 shows that the increased exposure dose due to scattered electrons in high pattern density regions, has shifted the amount of exposure energy received at trench 43, to be much nearer to the value of the clearing dose 20, than for a low pattern density region, such as low pattern density region 42. Long range scatter has a negligible effect on the pattern feature contrast in low pattern density regions, as shown by differences 40 and 41, where the amount of exposure energy introduced into the resist layer has shifted the bottom of the trenches 44 only slightly closer to the clearing dose 20. For a developed layer of electron beam sensitive material (not shown), pattern feature contrast relates the difference in the thickness between unexposed areas of the resist layer as compared to their original deposited thicknesses.

FIG. 4 illustrates a dose modification proximity effect correction profile 50, where the dose modification proximity effect correction method has been performed for the features shown in FIG. 1. The modified incident dose of exposure energy introduced into the undeveloped resist layer is plotted on the vertical axis, and the pattern position including feature geometry and gap spacing are depicted along the horizontal axis. Clearing dose 20 is identical to the clearing dose of FIG. 3. The trenches 60 of dose modification proximity effect correction profile 50 correspond to the raised features 10 of FIG. 1, while the peaks 55 correspond to the gaps 15. The modified incident dose energy level 56, introduced across the peaks 55, reduces the background dose level for the resist layer in the high pattern density region 62 surrounding trench 60. The pattern feature contrast for an undeveloped layer of electron beam sensitive material, as depicted by difference 57, is larger than difference 39 in FIG. 3, due to a decrease in the exposure dose attributable to backscattered electrons introduced into the resist layer of feature 10, at trench 60.

The dose modification proximity effect correction method illustrated in FIG. 4 employs an iterative scheme utilizing an equation, such as, for example, equation (1), representing a phenomenological transport equation, relating the incident and backscattered doses as:

$$D_r(r) = D_i(r) + \int d^2r' D_i(r') p_b(|r-r'|) \quad (1)$$

where $D_r(r)$ represents the resultant (total) exposure dose received at position r, including scatter; $D_i(r)$ represents the incident exposure dose at position r; and the integral represents the sum of doses received at position r from adjacent positions r' due to backscattering. (See, "Efficiency of electron-beam proximity effect correction", *J. Vac. Sci. Technol.* B 11 (6), Nov./Dec. 1993, authored by T. R. Groves and incorporated herein by reference). Dose modification methods solve equation (1) by first designating a desired resultant dose $D_r$, greater than the clearing dose but less than the uncorrected total dose illustrated in FIG. 3, and then computing the incident dose $D_i$ required to produce the designated resultant dose. Successive iterations are performed until $D_i$ converges and identifies a single dose, at which all of the pattern features are then uniformly exposed (e.g., modified incident dose level 56 introduced across the peaks 55 of FIG. 4). Basically, the above described dose modification proximity effect correction method reduces the background dose in high pattern density regions by exposing the resist using a lower incident exposure dose, thus, widening the dose gap between all exposed and unexposed areas of the layer of electron beam sensitive resist, and reducing the demands on resist contrast. Reducing the demands on resist contrast alleviates other problems associated with the formation of resist features on the surface of a substrate, such as deformations in the developed pattern features introduced by small changes to the incident dose energy as well as to changes in the parameters (e.g., the time of the development, and the concentration and temperature for the development solution) associated with the development of the electron beam sensitive resist material.

However, as feature dimensions shrink proximity effect corrections which only improve the contrast between exposed and unexposed areas of a layer of electron beam sensitive resist, such as dose modification methods, are not sufficient for critical dimension control. Critical dimension control refers to the linewidth differences of a feature as designed, compared to the developed linewidth dimensions of the same feature. For any developed feature, the slope of the resist wall is determined by the scattering characteristics in the resist and the blur of the incident electron beam (short range scatter). The scattering effects attributable to electron-resist interactions and electron beam blur are greater at the top of a resist feature, thus, increasing the radiation dose of the resist in these areas, and producing exposure dose profiles that have peaks with wider dimensions at their base than at their top (for positive tone materials) such as, for example, an undeveloped submicron feature represented by the peaks 72, 74, and 76, illustrated in FIG. 5A.

When the short range scatter effects are small compared to the minimum feature size of the pattern, then all of the features are developed at or near the as designed dimensions. However, as feature dimensions shrink, the short range scatter effects cannot be neglected. FIG. 5A illustrates the exposure dose profile 70 for an undeveloped submicron feature comparing three different background exposure levels. The incident dose energy introduced into the layer of electron beam sensitive resist is plotted on the vertical axis, while the feature width is depicted along the horizontal axis. The horizontal line again represents the resist clearing dose 20. A pattern representative of dose profile 70 is illustrated in FIG. 5B, where the incident dose of electron beam energy has been introduced into a layer of electron beam sensitive material 81 located on the surface of a substrate 80 and the pattern developed. The top of each peak 72, 74, and 76 in FIG. 5A corresponds to open areas 82, 84, and 86 respectively, in the resist layer of FIG. 5B. The valleys on each side of peaks 72, 74, and 76 correspond to the resist material 81. The width of each open area 82, 84, and 86 corresponds to the width of the respective peak 72, 74, and 76 bifurcated by the clearing dose 20. Any point that receives more than the clearing dose 20 is completely cleared of resist and any point below this level has resist remaining thereon. The wall profiles for peaks 72, 74, 76 are not vertical, due to short range scatter, so as the incident dose or the background level is varied, the point at which the clearing dose intersects the wall profile changes, creating open areas 82, 84, and 86 with varying widths. For example, the open area 82 that corresponds to the peak with the largest background dose, peak 72, has dimensions larger than the open area 86 that corresponds to the peak with the smaller background dose, peak 76. Thus, open areas 82 and 86 are wider and narrower, respectively, than their as designed dimensions. However, peak 74, which depicts the clearing dose 20 as intersecting the background dose level at the half-way point of the dose profile, creates an open area 84 whose dimensions are equivalent to the as designed value.

Biasing methods are used to correct proximity effects attributable to short range scatter. Biasing merely adjusts (makes larger or smaller) the widths of the shapes to be exposed in order to correct for predicted dimension deviations expected in the developed features. For example, if a 1.0 μm pattern feature after development has a dimension of 0.85 μm, biasing adjusts (makes larger) the width at which the pattern feature is exposed in order to compensate for the dimension reduction due to the short range scattering of electrons. A major problem encountered when correcting for short range scatter with biasing techniques, is that the shape of the short range exposure profile, such as, for example, dose profile 70), must be known precisely in order to adjust the feature dimensions. It is particularly difficult to obtain this information, since the exposure profile is dependent upon resist properties, exposure tool properties and exposure conditions, such as, for example, the beam current. In addition, biasing changes the pattern density, which impacts the dose modification result, so that for proximity effect corrections utilizing dose modification and biasing methods, both correction procedures may have to be repeated several times. Accordingly, proximity effect correction methods that are simple and accurate are still being sought.

SUMMARY OF THE INVENTION

The present invention is directed to a method which compensates for proximity effects attributable to both short range and long range scatter. Short range scatter effects are reduced by designating the clearing dose for an edge of a raised pattern feature, as a function of the dose height. The dose height as used herein refers to the difference on a dose profile in the dose energy, at two different points separated a vertical distance on the edge of a pattern feature. In one example, dose height is the difference between the dose at the bottom and the dose at the top of a line on a dose profile that corresponds to a pattern feature edge. Since the dose height is the difference between the two doses at the edge of a pattern feature, it follows that the larger of the two doses used to determine the dose height is greater than the clearing dose and the smaller of the two doses is less than the clearing dose. For example, with reference to points 58 and 59 on FIG. 4, the dose height is the difference in the dose energy between point 58 and point 59. The designation of the clearing dose as a function of the dose height is advantageous because the point at which the clearing dose intersects the edges of a pattern feature determines the width of the developed resist structure, and thus critical dimension control is maintained with respect to the as designed pattern feature widths.

Long range scatter effects are reduced by adjusting the incident exposure dose individually at the edge of each raised pattern feature as a function of the pattern density. As such, depending on the density of pattern features in an area surrounding the edges of a particular pattern feature, the incident exposure dose used to introduce an image of the pattern feature into a layer of electron beam sensitive resist, is potentially different at each edge of the pattern feature. The adjustment of the incident exposure dose level at each edge of a pattern feature based on pattern density is advantageous because background dose levels are decreased in high pattern density areas, and are increased in low pattern density areas, improving resist contrast for both types of pattern areas.

In one example of the method of the present invention, an uncorrected dose profile is obtained for the pattern features to be introduced into a layer of electron beam sensitive material, including a determination of the clearing dose for the electron beam sensitive resist and the dose height at the edges of each raised pattern feature. Thereafter, the incident dose of exposure energy used to introduce an image of a pattern into a layer of electron beam sensitive material is adjusted, by designating the clearing dose for each edge of the pattern feature as a function of the dose height.

The incident dose of exposure energy is adjusted at each edge of the pattern feature by successively iterating a phenomenological transport equation such as, for example, equation (2) relating the incident dose, the long range scatter dose, and the short range scatter dose as:

$$D_c(r) = kD_i(r) + \int d^2 r' D_i(r') \rho_b(|r-r'|) \quad (2)$$

where $D_c(r)$ represents the clearing dose for the electron beam sensitive resist obtained from the uncorrected dose profile; $D_i(r)$ represents the incident exposure dose at position r; the integral represents the sum of the doses received at position r from adjacent positions r' due to backscattering, including the backscatter spreading function represented by $\rho_b$; and constant k represents the correction for the short range scattering of electrons. The constant k is an expression of the fraction of the dose height at which the clearing dose line intersects the dose height. As such, the short range scattering correction constant k with a value within the range 0<k<1, effectively allows the point where the clearing dose line intersects the dose height, to be varied. Since, for pattern feature width control, it is preferable for the clearing dose line to intersect the dose height at the midway point, it is advantageous if k≅0.5.

The method of the present invention adjusts the incident dose of exposure energy through the selection of a value for constant k, which determines the point where the clearing dose line intersects the dose height on a dose profile, representing the edge of the pattern feature. Thereafter, the incident dose $D_i$ required to produce the selected clearing dose is determined from equation (2) where successive iterations are performed until $D_i$ converges identifying the adjusted incident dose for introducing the image of the pattern feature edge into the resist. This process of adjusting the incident exposure dose is then repeated for each feature edge of the pattern feature and also for each pattern feature to be written with the electron beam tool.

The method of the present invention optionally includes a calibration step for obtaining the uncorrected exposure dose profile which details a composite representation of long range and short range scatter effects for a test pattern exposed and developed in a layer of electron beam sensitive resist. The calibration step includes introducing an image of a test pattern into a layer of electron beam sensitive material, and, following the development of the test pattern, measuring the resist feature parameters to obtain the clearing dose and the dose height. Resist feature parameters useful for particular electron beam resist systems determined during the calibration step are optionally stored in a central processing unit (CPU) and used for adjusting the incident dose energy of subsequently written patterns.

The pattern features of the present method are optionally partitioned into a plurality of subshapes. Thereafter the incident dose of exposure energy for introducing an image of each subshape into a layer of electron beam sensitive resist is adjusted for each edge of each subshape by designating the clearing dose for each edge of each subshape, as a function of the dose height.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION

Figure 6:
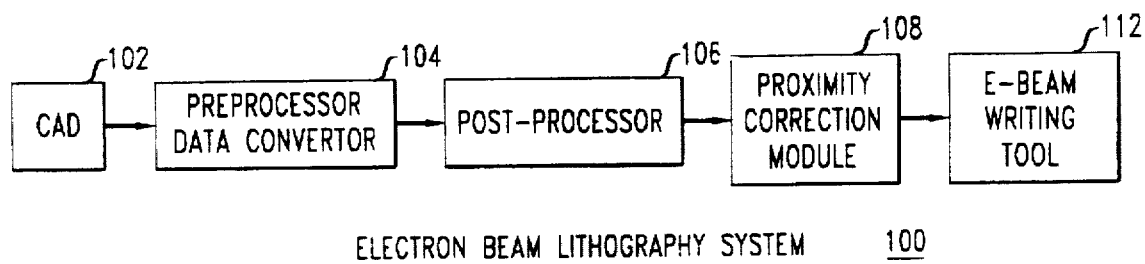
FIG. 6 is a block diagram of an electron beam lithography system.

FIG. 6 shows an illustrative application of the present invention wherein a correction method for proximity effects is performed utilizing an electron beam lithography system, such as, for example, electron beam lithography system 100. Electron beam lithography system 100 includes computer assisted design (CAD) unit 102, preprocessor data converter 104, post-processor 106, proximity correction module 108, and electron beam writing tool 112. Such component parts will be discussed in conjunction with the following explanation of the disclosed correction method for proximity effects. Electron beam lithography system 100 optionally couples a central processing unit (CPU) (not shown) to electron beam writing tool 112, where the computer assisted design (CAD) unit, preprocessor data converter, post-processor, and proximity correction module are incorporated in the CPU.

One embodiment of the present correction method for proximity effects includes the step of generating a geometrical pattern containing features to be developed in a layer of electron beam sensitive resist, utilizing a computer assisted design (CAD) unit 102. Computer assisted design (CAD) equipment, incorporating software with hardware useful for the design of pattern features in electron beam lithography systems are well known, an example of which includes AutoCad. Computer assisted design (CAD) unit 102 provides pattern data to preprocessor data converter 104, which optionally partitions the geometrical pattern data generated by the CAD unit into a plurality of subshapes, where each subshape has a specified size. For example, a line pattern generated with the computer assisted design (CAD) unit 102 having dimensions of 1.0 μm×0.5 μm is partitionable into 50 subshapes having dimensions of 0.1 μm×0.1 μm, which is also the typical address size (diameter) for the electron beam of an electron beam writing tool. For the example described above, the dimensions of each subshape are identical. However, subshapes need not have uniform geometries and the dimensions of individual subshapes are variable. Geometrical pattern data is optionally provided to preprocessor data converter 104 through an interface (not shown) where the remote end (not shown) is assumed to be terminated in a central processing unit, or CAD equipment.

Figure 3:
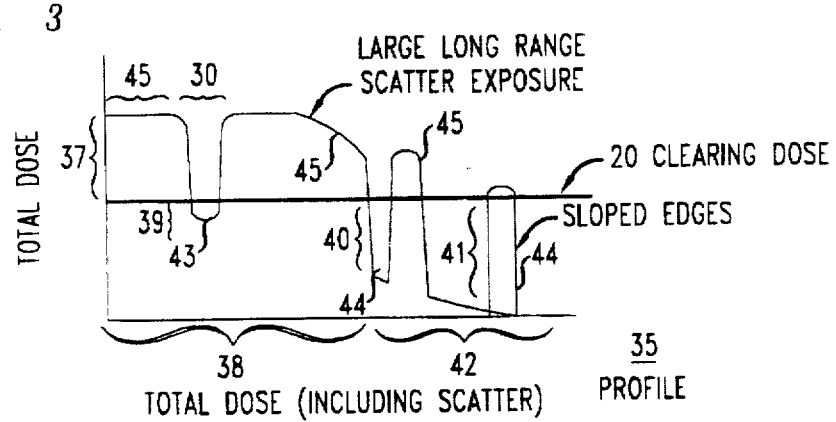
FIG. 3 illustrates the total exposure energy that is introduced into electron beam sensitive resist for the features of FIG. 1.

Partitioned or unpartitioned pattern data is provided to post-processor 106 from preprocessor data converter 104, which functions together with proximity correction module 108 to determine the incident dose required to introduce an image of the geometrical pattern features into a layer of electron beam sensitive resist. First, post-processor 106 uses the pattern data provided by pre-processor data converter 104 to calibrate the relevant properties of the electron beam lithography system. The post-processor 106 calibration method includes exposing (writing) the set of specific pattern shapes into a layer of electron beam sensitive resist with the e-beam writing tool 112, and following the development of the pattern, measuring the resist features to obtain an uncorrected exposure dose profile which includes both long and short range scatter effects and which is similar to, for example, the dose profile of FIG. 3, as previously discussed. The electron beam sensitive resist features to be determined during the calibration process include the clearing dose and the dose height at each edge of each pattern feature. Optionally, resist feature parameters useful for particular electron beam resist systems, determined during this calibration step are stored in post-processor 106 to be used for subsequently written patterns.

Figure 5A:
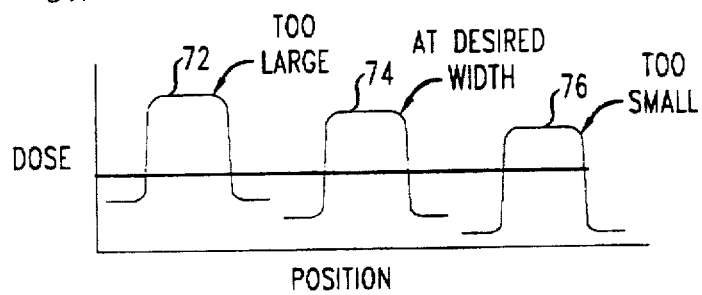
FIG. 5A illustrates short range scatter effects for a submicron feature comparing three different background exposure levels.
Figure 5B:
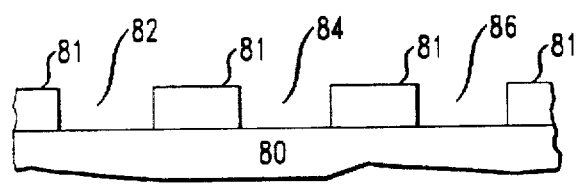
FIG. 5B represents the pattern of FIG. 5A which has been exposed and developed in a layer of electron beam sensitive resist.

The post-processor calibration step provides the data necessary for proximity correction module 108, to adjust the incident exposure dose energy needed to introduce an image of the pattern features into a layer of electron beam sensitive resist, thereby correcting for effects attributable to long range and short range scattering. Corrections for both long range and short range scatter, do not have to be performed separately. As described below, if certain conditions are maintained it is possible to combine the steps of correcting for both types of scattering effects in a straightforward manner. Furthermore, the details of the short range scatter exposure profile, which are, for example, depicted in FIG. 5, are not necessary.

The disclosed dose modification proximity effect correction method adjusts the incident dose of exposure energy for unpartitioned pattern data at each edge of the pattern feature by successively iterating a phenomenological transport equation such as, for example, equation (2) relating the incident exposure dose, the long range scatter dose, and the short range scatter dose as:

$$D_r(r) = kD_i(r) + \int d^2 r' D_i(r') p_b(|r-r'|) \tag{2}$$

where $D_r(r)$ represents the clearing dose for the electron beam sensitive resist obtained from the uncorrected dose profile determined during the post-processor calibration step; $D_i(r)$ represents the incident exposure dose at position r; the integral represents the sum of the doses at position r received from adjacent positions r' due to backscattering, including the backscatter spreading function represented by $\rho_b$; and constant k represents the correction for the short range scattering of electrons.

The short range scattering correction constant k is an expression of the fraction of the dose height where the clearing dose line intersects the dose height representing the edge of a pattern feature. Constant k has a value within the range 0<k<1, thus effectively allowing the point where the clearing dose line intersects the dose height, to be varied. The short range scattering correction constant, k, eliminates the need to know the precise shape of the short range scatter energy distribution, when k=0.5, since this is the point where the width of a developed resist feature has dimensions equivalent to the as designed value. For example, the exposure dose profile D(x), for the edge of each pattern feature is described mathematically as, $$D(x) = \int P(x')\Phi(x-x')dx' \quad (3)$$

where P(x') is the short range scatter distribution function and $\Phi(x-x')$ is the step function. Since the step function $\Phi(x-x')$ equals 1 at the edge of a pattern feature, equation (3) simplifies to $$D(x) = \int P(x')dx' \quad (4)$$

A typical short range scatter distribution function is mathematically represented as Gaussian and radially symmetric as in equation (5), $$P(x') = (1/\sigma_f^2)e^{-(x^2/\sigma_f^2)} \quad (5)$$

where $\sigma_f$ is the short range scattering width. Thus, equations (4) and (5) are used to determine D(x), at x=0, the point at which proximity effects due to short range scatter equal zero. When x=0, equation (4) reduces to D(x)=0.5. Physically, this means that the short range scattering effects are eliminated at the halfway point of the exposure dose profile for the edge of a pattern feature. As a result, the clearing dose should intersect each edge of a pattern feature halfway through the dose profile, in order to correct for short range scatter, which is also the point at which k=0.5 and where the widths of the developed resist features have dimensions equivalent to the as designed value.

The disclosed dose modification method determines the adjusted incident dose, $D_i$, needed to expose a particular edge of the pattern feature, by designating a value for constant k, and then solving equation (2) utilizing the clearing dose determined during the calibration step, or optionally stored in post-processor 106. The value of constant, k, fixes the point at which the clearing dose will intersect the dose height on a dose profile and determines the width of the subsequently developed pattern feature. Successive iterations are performed until $D_i$ converges and identifies the incident dose for exposing that edge of the feature. This process of adjusting the incident exposure dose is then repeated for each edge of the pattern feature and for the edges of each pattern feature to be written with the electron beam writing tool 112.

Figure 4:
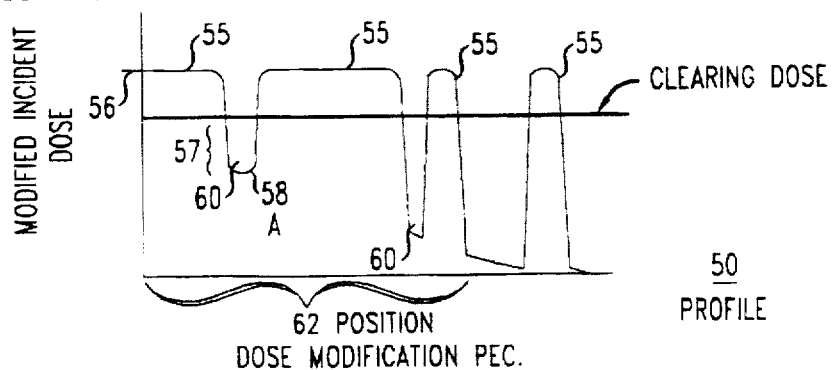
FIG. 4 illustrates a prior art dose modification proximity effect correction profile for the features of FIG. 1.

After the adjusted incident exposure dose for each edge of each pattern feature has been determined, such data is compiled in proximity correction module 108 and subsequently provide to electron beam writing tool 112. Electron beam writing tool 112 thereafter introduces an image of the pattern features into a layer of electron beam sensitive resist. Thus, instead of exposing a pattern feature using a single incident exposure dose as illustrated in FIG. 4, which is representative of prior art methods, the disclosed method corrects effects attributable to both long range and short range scatter by varying the incident exposure dose across each pattern feature so that the clearing dose intersects the edge of the pattern feature as a function of the dose height, as shown in FIG. 7.

Figure 1:
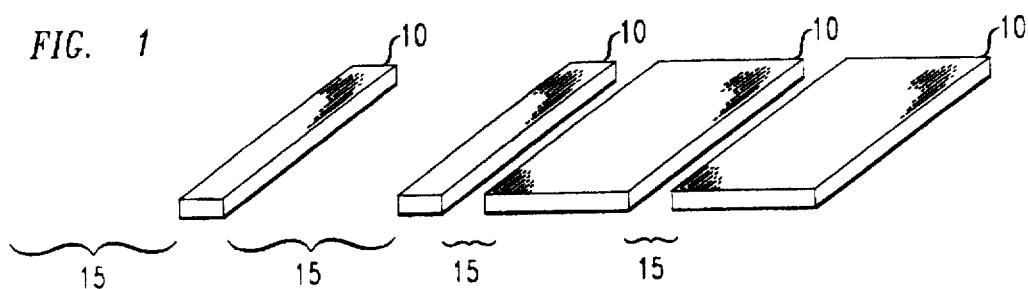
FIG. 1 is an illustrative example of a design containing several features to be exposed in electron beam sensitive resist.
Figure 2:
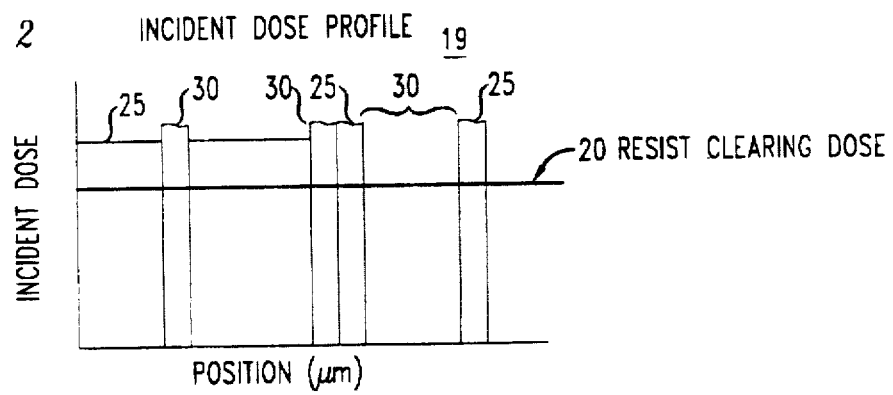
FIG. 2 is the dose profile for the cross-section of the features shown in FIG. 1.
Figure 7:
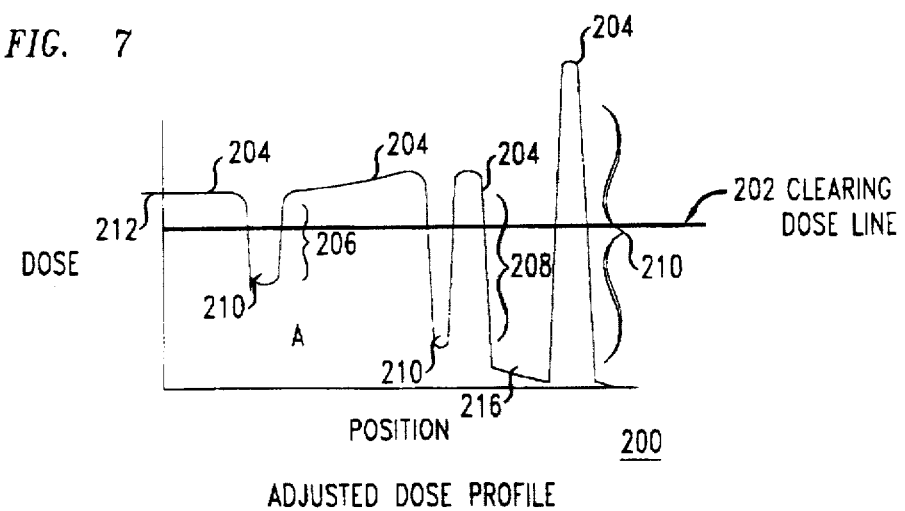
FIG. 7 illustrates the disclosed dose modification proximity effect correction profile for the features of FIG. 1.

FIG. 7 illustrates an adjusted dose profile 200, where the disclosed dose modification proximity effect correction method has been performed for the features 10 of FIG. 1. The adjusted incident dose energy introduced into the undeveloped resist layer is plotted on the vertical axis, and the pattern position including feature geometry and gap spacing are depicted along the horizontal axis. The trenches 216 of adjusted dose profile 200 correspond to the raised features 10 of FIG. 1, while the peaks 204 correspond to the gaps 15. The solid line intersecting each trench 216 is the clearing dose 202. Differences 206, 208, and 210 represent the dose heights for the edges of each trench 216. The adjusted incident exposure dose 212 is varied across each peak 204, while the clearing dose 202 line bifurcates each edge of each pattern feature as a function of the dose height. In the example depicted in FIG. 7, constant k=0.5. The calculation of the corrected incident dose $D_i$ results in the solid line representative of the clearing dose 202 being positioned exactly half-way along each edge of each feature 10 represented by differences 206, 208, and 210, which is also equivalent to the as designed dimension widths for each of the features 10.

While the disclosed proximity effect correction method has been described with respect to each edge of an unpartitioned pattern feature, the above described method is also applicable to partitioned pattern data. For pattern data that has been partitioned into a plurality of subshapes, the disclosed dose modification method adjusts the incident dose of exposure energy at each edge of a subshape by successively iterating equation (2) as previously discussed. Once the adjusted incident exposure dose for each edge of each subshape has been determined, the data is compiled in proximity correction module 108 and subsequently provided to electron beam writing tool 112, for later introduction into a layer of electron beam sensitive resist.

It should, of course, be understood that while the present invention has been described in reference to an illustrative embodiment, other arrangements may be apparent to those of ordinary skill in the art. For example, while the disclosed embodiment calculates the clearing dose utilizing a phenomenological transport equation to relate the incident and scattered doses, other equations incorporating scattered and incident doses can be implemented.

The invention claimed is:

1. Method for correcting proximity effects in an e-beam lithography system, the method comprising the steps of:

applying an electron beam sensitive resist material onto a substrate;

introducing an image of a pattern into the electron beam sensitive resist material, wherein the incident dose of radiation used to introduce the image of the pattern into the resist material is adjusted by obtaining an exposure dose profile of the pattern, determining a dose height that corresponds to each edge of a feature in said pattern, determining a clearing dose for each of said edges of the feature as a function of said dose height, and then determining an incident dose of radiation based upon the clearing dose; and developing the image of said pattern.

2. The method of claim 1, wherein said exposure dose profile is obtained from a calibration process comprising the steps of:
   applying an electron beam sensitive resist material onto a substrate;
   introducing an image of a test pattern into the electron beam sensitive resist material;
   developing the image of said test pattern; and
   determining the dose height and the clearing dose for said test pattern in the electron beam sensitive resist material.

3. The method of claim 1, wherein said exposure dose profile is defined by the Gaussian equation, $$P(x') = (1/\sigma_f^2)e^{-(r^2/\sigma_f^2)}$$

where P(x') is the short range scatter distribution function for the incident dose of radiation introduced at position r and $\sigma_f$ is the short range scatter width for the incident dose of radiation.

4. The method of claim 3, wherein the incident dose of radiation is determined from, $D_r(r)=kD_i(r)+\int d^2r' D_i(r')P_b(|r-r'|)$, where $D_c(r)$ is the clearing dose for the electron beam sensitive resist material, $D_i(r)$ is the incident dose of radiation introduced at position r, the integral $\int d^2r' D_i(r')\rho_b(|r-r'|)$ is the sum of the doses of radiation received at position r from adjacent positions r' due to backscattering $\rho_b$ is the backscatter spreading function, and k is the correction for the short range scatter of the radiation.

5. The method of claim 4, wherein k is within the range 0<k<1.

6. The method of claim 4, wherein k=0.5.

7. The method of claim 1, wherein the clearing dose is the value on the dose profile that intersects the dose height at the halfway point.

8. The method of claim 1, wherein each feature is divided into a plurality of subshapes and the incident dose of radiation is adjusted for each edge of said subshape.

* * * * *